United States Patent [19]
Takemoto

[11] Patent Number: 6,064,867
[45] Date of Patent: May 16, 2000

[54] RECEIVING APPARATUS WITH AUTOMATIC FREQUENCY CONTROLLING

[75] Inventor: Makoto Takemoto, Yokohama, Japan

[73] Assignee: Matsushita Electric Industrial Co., Ltd., Japan

[21] Appl. No.: 08/922,328

[22] Filed: Sep. 3, 1997

[30] Foreign Application Priority Data

Sep. 24, 1996 [JP] Japan ................................. 8-251085

[51] Int. Cl.$^7$ .................................................. H04B 1/10
[52] U.S. Cl. ................................. 455/192.2; 455/192.3; 455/255; 455/257
[58] Field of Search ........................... 455/192.1, 192.2, 455/192.3, 255, 256, 257

[56] References Cited

U.S. PATENT DOCUMENTS

| | | | |
|---|---|---|---|
| 4,849,995 | 7/1989 | Takeo et al. .......................... | 375/116 |
| 5,335,348 | 8/1994 | Kono .................................... | 455/192.2 |
| 5,423,085 | 6/1995 | Lim ..................................... | 455/192.2 |
| 5,513,388 | 4/1996 | Sugamuna ............................ | 455/192.2 |
| 5,566,211 | 10/1996 | Choi .................................... | 455/192.2 |
| 5,574,998 | 11/1996 | Andoh .................................. | 455/192.2 |
| 5,768,321 | 6/1998 | Watanabe et al. .................... | 455/192.2 |
| 5,774,800 | 6/1998 | Mori .................................... | 455/255 |

*Primary Examiner*—Daniel S. Hunter
*Assistant Examiner*—Thuan T. Nguyen
*Attorney, Agent, or Firm*—Parkhurst & Wendel, L.L.P.

[57] ABSTRACT

A receiving apparatus is disclosed which comprises: a receiving circuit for receiving time-division-duplexed first and second radio wave paging signals, having the same carrier frequency, including first and second data having different first and second data rates respectively, a frequency converting circuit for frequency-converting an output of the receiving circuit with a local oscillation signal from a local oscillator; a demodulator for demodulating an output of the frequency converting circuit and outputting a demodulated signal; a detection circuit for detecting the synchronizing word from the demodulated signal, detecting whether a frame synchronizing condition is established, and detecting whether the first radio wave signal is being received; a frequency error detection circuit for detecting a frequency error in the output of the demodulation means; and a frequency control circuit responsive to the detection circuit for controlling a local oscillation frequency of the local oscillator according to the detected frequency error only while the first radio wave signal is being received. Automatic frequency controlling is effected only during the interval of receiving the desired radio wave paging signal.

8 Claims, 3 Drawing Sheets

RECEIVING APPARATUS WITH AUTOMATIC FREQUENCY CONTROLLING

BACKGROUND OF THE INVENTION

1. Field of the Invention

This invention relates to a receiving circuit with automatic frequency controlling.

2. Description of the Prior Art

A receiving circuit with automatic frequency controlling is known. In such a prior art receiving circuit, the local oscillation frequency is controlled by the detected frequency error from the demodulation output.

FIG. 6 is a block diagram of a prior art receiving apparatus with automatic frequency controlling.

The prior art receiving apparatus comprises a receiving circuit 109 for receiving a radio wave signal, a frequency converting circuit 101 for frequency-converting an output of the receiving circuit 109 with a local oscillation signal, a local oscillator 102 for generating the local oscillation signal in accordance with a frequency control signal, a demodulator 103 for demodulating an output of the frequency converting circuit 101 and outputting a demodulated signal, a frequency error detection circuit 104 for detecting a frequency error in the output of the demodulator 103, and an automatic frequency control circuit 106 for generating the frequency control signal with a value of the frequency control signal varied in accordance with the detected frequency error.

FIG. 7 is a time chart of a prior art paging system.

In this paging system, a radio wave signal according to the protocol of CCIR (International Radio consultative Committee) RADIO PAGING CODE NO. 1 and a radio wave signal according to the protocol of FLEX are transmitted from the same base station with the same carrier frequency by a time-division duplex format as shown. Data in the radio wave signal according to the protocol of FLEX and the radio wave signal according to the protocol of CCIR RADIO PAGING CODE NO. 1 include first and second data having different first and second data rates respectively, namely, 3200 symbol/sec and 1200 symbol/sec. Therefore, the automatic frequency controlling operation is not simple.

SUMMARY OF THE INVENTION

The aim of the present invention is to provide an improved receiving apparatus with automatic frequency control.

According to the present invention, a first receiving apparatus is provided, which comprises: a receiving circuit for receiving time-division-duplexed first and second radio wave signals, having the same carrier frequency, including first and second data having different first and second data rates respectively, each of the first and second data including synchronizing word; a frequency converting circuit for frequency-converting an output of the receiving circuit with a local oscillation signal; a local oscillation circuit for generating the local oscillation signal in accordance with a frequency control signal; a demodulation circuit for demodulating an output of the frequency converting circuit and outputting a demodulated signal; a detection circuit for detecting the synchronizing word from the demodulated signal, detecting whether a frame synchronizing condition is established, and detecting whether the first radio wave signal is being received; a frequency error detection circuit for detecting a frequency error in the output of the demodulation circuit; and a frequency control signal generation circuit for generating the frequency control signal with a value of the frequency control signal varied in accordance with the frequency error while the first radio wave signal being received and for generating the frequency control signal with the value held while the first radio wave signal is not being received.

In the first receiving apparatus, the frequency error detection circuit comprises: a sampling circuit for sampling the demodulated signal; a max and minimum detection circuit for detecting maximum and minimum values of the demodulated signal at two consecutive sampling points; and an averaging circuit for providing a mean value from the maximum and minimum values.

In the first receiving apparatus, the frequency control signal generation circuit generates the frequency control signal with the value of the frequency control signal varied in accordance with the frequency error when the frame synchronizing condition is established.

In the first receiving apparatus, the frequency control signal generation circuit generates the frequency control signal with the value of the frequency control signal varied when the mean value is without a predetermined range.

According to the present invention, a second receiving apparatus is provided, which comprises: a receiving circuit for receiving time-division-duplexed first and second radio wave signals, having the same carrier frequency, including first and second data having different first and second data rates respectively, each of the first and second data including a synchronizing word; a frequency converting circuit for frequency-converting an output of the receiving circuit with a local oscillation signal; a local oscillation circuit for generating the local oscillation signal; a demodulation circuit for demodulating an output of the frequency converting circuit and outputting a demodulated signal; a detection circuit for detecting the synchronizing word from the demodulated signal, detecting whether a frame synchronizing condition is established, and detecting whether the first radio wave signals is being received; a frequency error detection circuit for detecting a frequency error in the output of the demodulation circuit; and a frequency control circuit responsive to the detection circuit for controlling a local oscillation frequency of the local oscillation circuit in accordance with the detected frequency error only while the first radio wave signal is being received.

In the second receiving apparatus, the frequency control circuit holds the local oscillation frequency while the first radio wave signal is not being received.

In the second receiving apparatus, the frequency control circuit comprises a first comparator for comparing the mean value with a first reference, a second comparator for comparing the mean value with a second reference, an up-down counter having an up-count input responsive to the first comparator, a down-count input responsive to the second comparator for supplying a frequency control signal to the local oscillation circuit, and an enable/disable input responsive to the detection circuit, wherein the up-down counter up-counts when the mean value is higher than the first reference only while the first radio wave signal is being received, down-counts when the mean value is lower than the first reference only while the first radio wave signal is being received.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinbelow will be described an embodiment of this invention.

Figure 1:
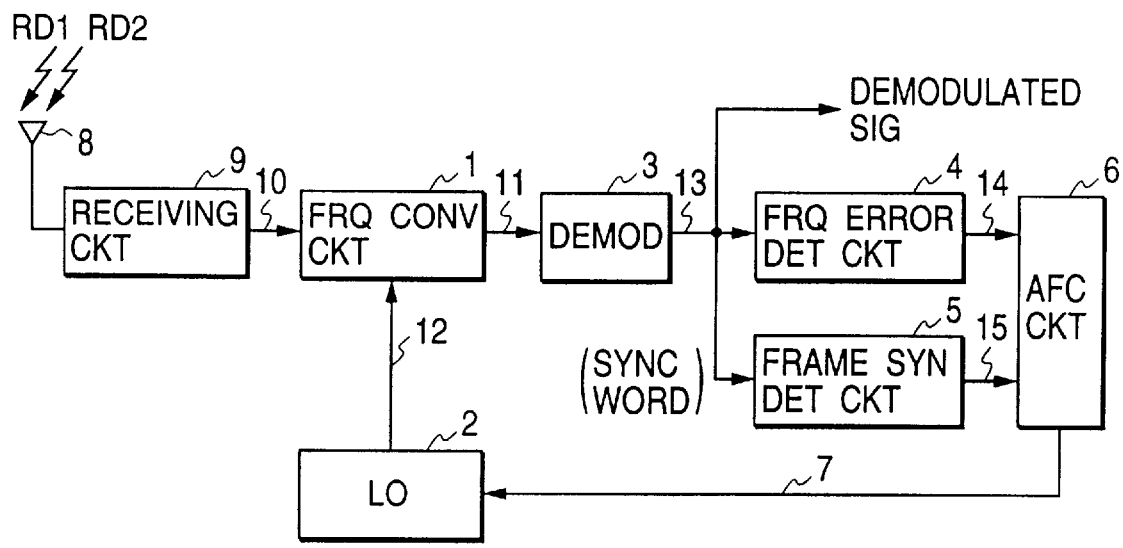
FIG. 1 is a block diagram of a receiving apparatus of an embodiment of the present invention.

FIG. 1 is a block diagram of a receiving apparatus of this embodiment. The receiving apparatus of this embodiment comprises: a receiving circuit 9 having an antenna 8 for receiving time-division-duplexed first and second radio wave signals RD1 and RD2, having the same carrier frequency, including first and second data having different first and second data rates respectively, each of the first and second data including a synchronizing word, a frequency converting circuit 1 for frequency-converting an output of the receiving circuit 9 with a local oscillation signal, a local oscillator 2 for generating the local oscillation signal in accordance with a frequency control signal 7, a demodulator 3 for demodulating an output 11 of the frequency converting circuit 1 and outputting a demodulated signal 13, a frame synchronizing detection circuit 5 for detecting the synchronizing word from the demodulated signal 13, detecting whether a frame synchronizing condition is established, and detecting whether the first radio wave signal is being received, a frequency error detection circuit 4 for detecting a frequency error in demodulated signal 13; and an automatic frequency control circuit 6 for generating the frequency control signal 7 with a value of the frequency control signal varied in accordance with the detected frequency error while the first radio wave signal RD1 being received and for generating the frequency control signal with the value held while the second radio wave signal RD2 is being received, that is, the first radio wave signal RD1 is not being received.

Figure 7:
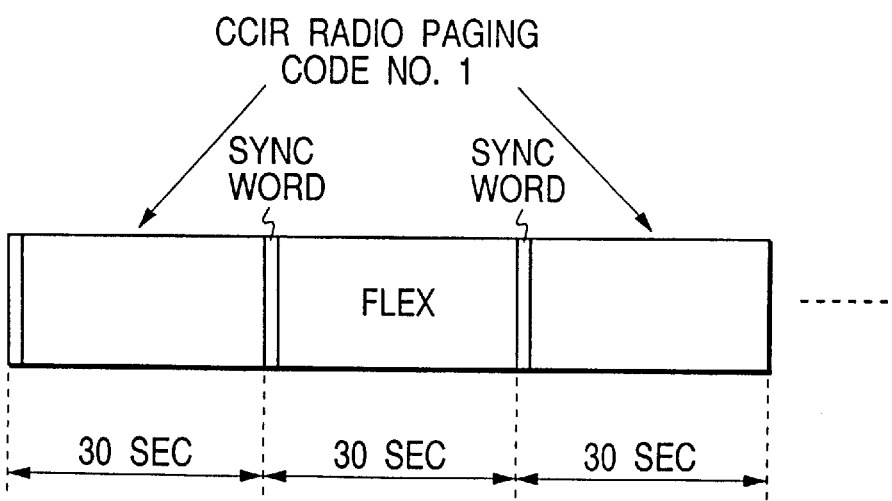
FIG. 7 is a time chart of a prior art paging system.

The receiving circuit 9 receives the time-division-duplexed first and second radio wave signals RD1 and RD2. The first and second radio wave signals RD1 and RD2 are transmitted from the same base station with the same carrier frequency but transmitted through time-division-duplexing as shown in FIG. 7. The first and second radio wave signals RD1 and RD2 include first and second data having different first and second data rates respectively, for example, 3200 symbol/sec and 1200 symbol/sec. The first and second data includes different synchronizing words. It is assumed that this receiving apparatus receives the first radio wave signal having the data rate of 3200 symbol/sec as the desired radio wave signal. The frequency converting circuit 1 frequency-converts the output 10 of the receiving circuit 9 with the local oscillation signal 12 to generate intermediate frequency signals. The local oscillator 2 generates the local oscillation signal 12 with its local oscillation frequency controlled in accordance with the frequency control signal 7. The demodulator 3 demodulates the output 11 of the frequency converting circuit 1 and outputs the demodulated signal 13.

Figure 2:
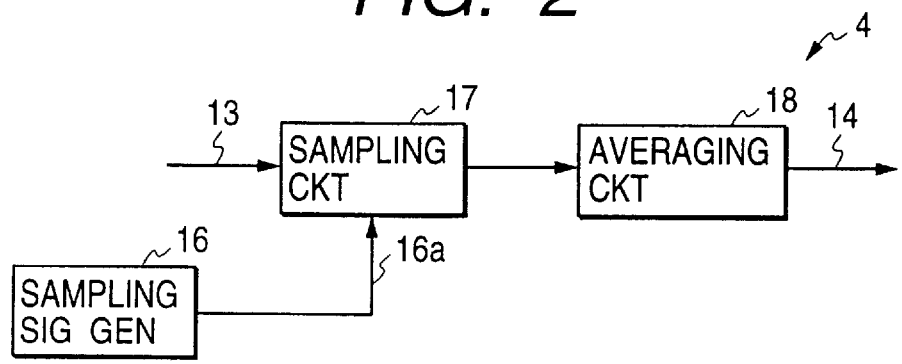
FIG. 2 is a block diagram of the frequency error detection circuit shown in FIG. 1.
Figure 3:
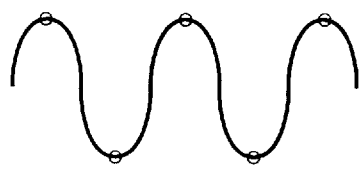
FIG. 3 is a graphical drawing for illustrating an operation of the frequency error detection circuit shown in FIG. 1.

FIG. 2 is a block diagram of the frequency error detection circuit 4 shown in FIG. 1. FIG. 3 is a graphical drawing illustrating an operation of the frequency error detection circuit 4.

The frequency error detection circuit 4 comprises a sampling signal generator 16 for generating a sampling signal 16a, a sampling circuit 17 for sampling the demodulated signal 13 at two consecutive sampling points in response to the sampling signal 16a to detect a maximum value and a minimum value of the demodulated signal 13, an averaging circuit 18 for averaging the maximum and minimum values to provide a mean value 14 as the frequency error.

The frame synchronizing detection circuit 5 detects the synchronizing word from the demodulated signal 13, detects whether a frame synchronizing condition is established by detecting the synchronizing word specified to the desired radio wave signal, and detects whether the first radio wave signal is being received and generates an enable/disable signal 15 indicating that the first radio wave signal is being received or that the first radio wave signal is not being received.

The automatic frequency control circuit 6 generates the frequency control signal 7 with the value of the frequency control signal varied in accordance with the detected frequency error (mean value) 14 while the first radio wave signal RD1 (the desired radio wave signal) being received and for generating the frequency control signal with the value held while the second radio wave signal RD2 is being received, that is, the first radio wave signal RD1 is not being received.

Figure 4:
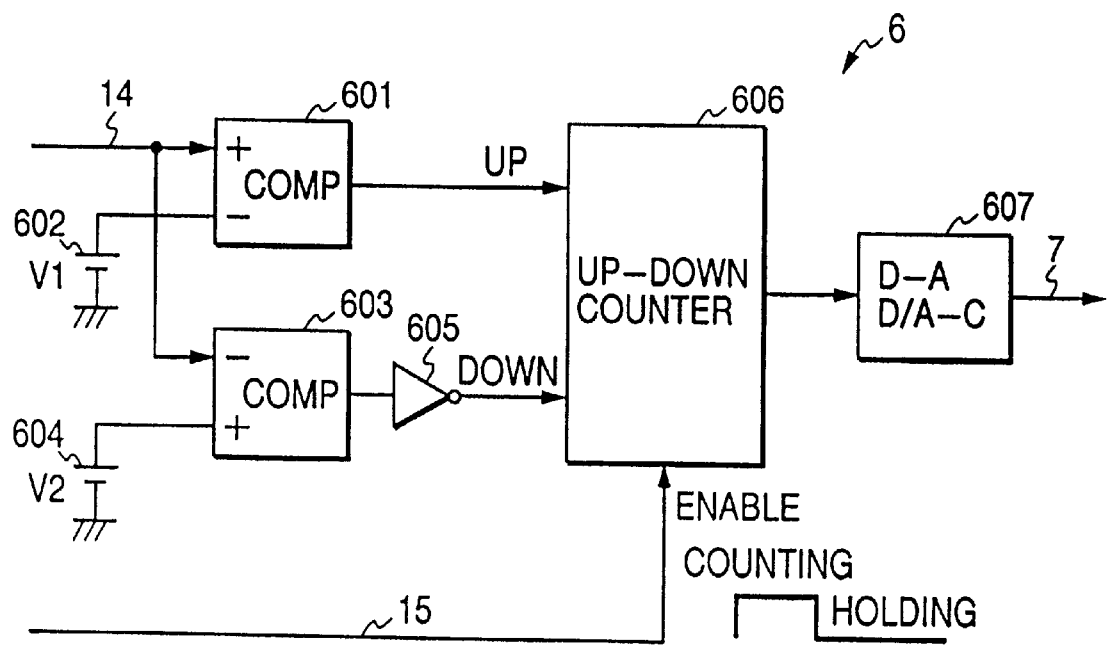
FIG. 4 is a block diagram of the automatic frequency control circuit shown in FIG. 1.

FIG. 4 is a block diagram of the automatic frequency control circuit shown in FIG. 1.

The automatic frequency control circuit 6 comprises a comparator 601 for comparing the mean value 14 with a first reference V1, a comparator 603 for comparing the mean value 14 with a second reference V2, an inverter 605 for inverting the output of the comparator 603, an up-down counter 606 for counting upwardly in response to the output of the comparator 601 and downwardly in response to the output of the inverter 605 when the enable/disable signal indicates that the first radio wave signal RD1 is being received and holds it output value when the enable/disable signal indicates that the first radio wave signal RD1 is not being received. That is, the second radio wave signal RD2 is being received, and a d/a-converter 607 for d/a converting the output of the up-down counter 606 to generate the frequency control signal 7.

The comparators 601 and 603 form a window comparator, so that the mean value 14 is within an allowable range, the up-down counter 606 does not count. If the mean value 14 is without the allowable range, the up-down counter 606 counts in response to the comparing results from the comparator 601 and 603.

The up-down counter 606 counts upwardly or downwardly only while the first radio wave signal RD1 is received and holds while the second radio wave signal RD2 is being received, that is, the first radio wave signal RD1 is not being received, so that the automatic controlling is stable.

Figure 5:
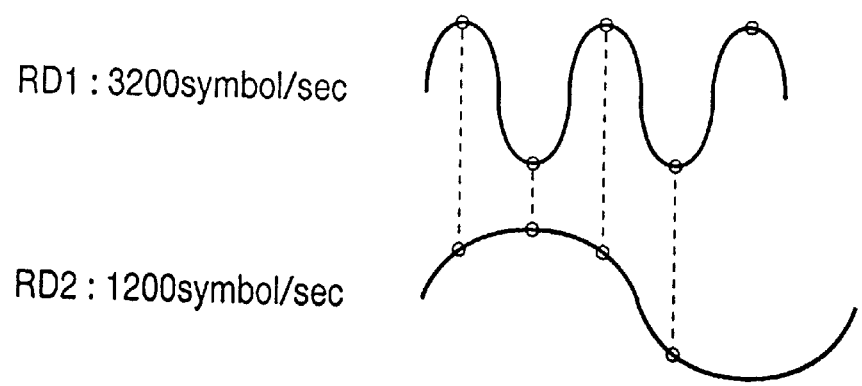
FIG. 5 is a graphical drawing illustrating an operation of the frequency error detection circuit shown in FIG. 1.
Figure 6:
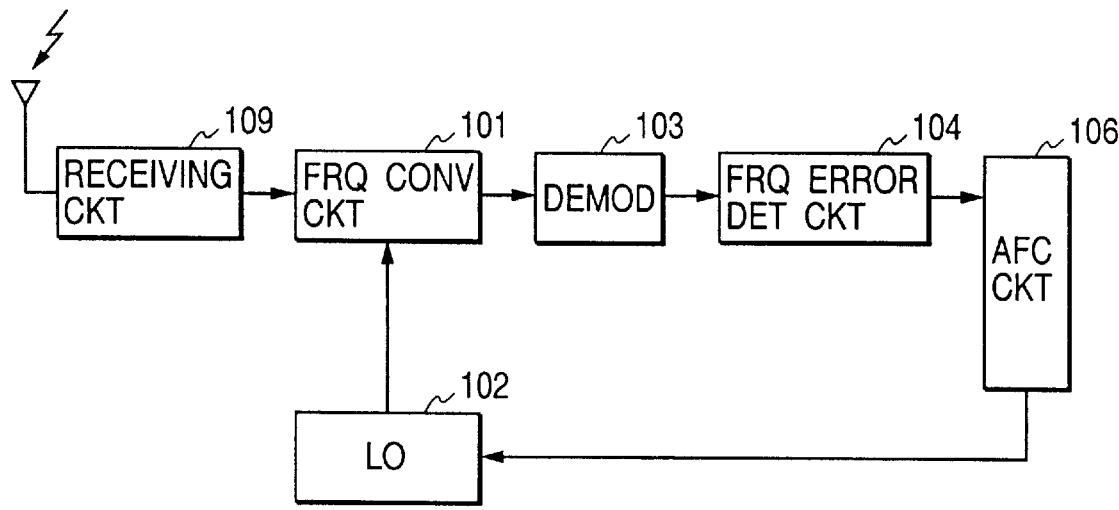
FIG. 6 is a block diagram of a prior art receiving apparatus with automatic frequency controlling.

FIG. 5 is a graphical drawing illustrating an operation of the frequency error detection circuit 4.

When the first radio wave signal RD1 is being received, two consecutive sampling points provides the maximum value and the minimum value and the frequency error detection circuit 4 outputs the mean value as the frequency error without an error. On the other hand, when the second radio wave signal RD2 including data of 1200 symbol/sec is being received, two consecutive sampling points cannot provide the maximum value and the minimum value correctly, so that the output of the frequency error detection circuit 4 includes an error while the second radio wave signal RD2 is being received. However, during this interval, the up-down counter 606 does not respond to the outputs of the comparators 601 and 603 because the enable/disable 15 signal 15 indicates the disable condition. Therefore, the automatic frequency controlling can be provided stable though this receiving apparatus is used in a service area at which the first and second radio wave signals RD1 and RD2 are transmitted from the same base station with the same carrier frequency but transmitted through time-division-duplexing as shown in FIG. 7.

What is claimed is:

1. A receiving apparatus comprising:

receiving means for receiving time-division-duplexed first and second radio wave signals, having the same carrier frequency, including first and second data having different first and second data rates respectively, each of said first and second data including a synchronizing word;

frequency converting means for frequency-converting an output of said receiving means with a local oscillation signal;

local oscillation means for generating said local oscillation signal in accordance with a frequency control signal;

demodulation means for demodulating an output of said frequency converting means and outputting a demodulated signal;

detection means for detecting said synchronizing word from said demodulated signal, detecting whether a frame synchronizing condition is established, and detecting whether said first radio wave signal is being received;

frequency error detection means for detecting a frequency error in said output of said demodulation means; and frequency control signal generation means for generating said frequency control signal with a value of said frequency control signal is varied in accordance with said detected frequency error while said first radio wave signal being received and for generating said frequency control signal with said value held while said first radio wave signal is not being received.

2. A receiving apparatus as claimed in claim 1, wherein said frequency error detection means comprises:

sampling means for sampling said demodulated signal;

maximum and minimum detection means for detecting maximum and minimum values of said demodulated signal at two consecutive sampling points; and averaging means for providing a mean value from said maximum and minimum values to detect said frequency error.

3. A receiving apparatus as claimed in claim 1, wherein said frequency control signal generation means generates said frequency control signal with said value of said frequency control signal varied in accordance with said frequency error when said frame synchronizing condition is established.

4. A receiving apparatus as claimed in claim 1, wherein said frequency control signal generation means generates said frequency control signal with said value of said frequency control signal varied when said mean value is without a predetermined range.

5. A receiving apparatus comprising:

receiving means for receiving time-division-duplexed first and second radio wave signals, having the same carrier frequency, including first and second data having different first and second data rates respectively, each of said first and second data including a synchronizing word;

frequency converting means for frequency-converting an output of said receiving means with a local oscillation signal;

local oscillation means for generating said local oscillation signal;

demodulation means for demodulating an output of said frequency converting means and outputting a demodulated signal;

detection means for detecting said synchronizing word from said demodulated signal, detecting whether a frame synchronizing condition is established, and detecting whether said first radio wave signal is being received;

frequency error detection means for detecting a frequency error in said demodulated signal; and frequency control means responsive to said detection means for controlling a local oscillation frequency of said local oscillation means in accordance with said detected frequency error only while said first radio wave signal is being received.

6. A receiving apparatus as claimed in claim 5, wherein said frequency control means holds said local oscillation frequency while said first radio wave signal is not being received.

7. A receiving apparatus as claimed in claim 5, wherein said frequency error detection means comprises:

sampling means for sampling said demodulated signal;

maximum and minimum detection means for detecting maximum and minimum values of said demodulated signal at two consecutive sampling points; and averaging means for providing a mean value from said maximum and minimum values to detect said frequency error.

8. A receiving apparatus as claimed in claim 7, wherein said frequency control means comprises: a first comparator for comparing said mean value with a first reference;

a second comparator for comparing said mean value with a second reference; and, an up-down counter having an up-count input responsive to said first comparator, a down-count input responsive to said second comparator for supplying a frequency control signal to said local oscillation means, and an enable/disable input responsive to said detection means, wherein said up-down counter up-counts when said means value is larger than said first reference only while said first radio wave signal is being received, down-counts when said mean value is smaller than said first reference only while said first radio wave signal is being received.

* * * * *